United States Patent [19]
Kawagoe

[11] Patent Number: 5,623,451
[45] Date of Patent: Apr. 22, 1997

[54] SEMICONDUCTOR MEMORY DEVICE

[75] Inventor: Tomoya Kawagoe, Hyogo, Japan

[73] Assignee: Mitsubishi Denki Kabushiki Kaisha, Tokyo, Japan

[21] Appl. No.: 634,489

[22] Filed: Apr. 18, 1996

[30] Foreign Application Priority Data

Oct. 4, 1995 [JP] Japan .................................. 7-257440

[51] Int. Cl.⁶ .................................................. G11C 7/00
[52] U.S. Cl. .................... 365/222; 365/149; 365/189.01; 365/233.5
[58] Field of Search ................................. 365/222, 149, 365/189.01, 233, 233.5

[56] References Cited

FOREIGN PATENT DOCUMENTS 60-98665  6/1985  Japan .
3-283197 12/1991 Japan .
4-34794   2/1992  Japan .

*Primary Examiner*—David C. Nelms
*Assistant Examiner*—F. Niranjan
*Attorney, Agent, or Firm*—Lowe, Price, LeBlanc & Becker

[57] ABSTRACT

A DRAM includes an address registration circuit for registering an address of a row including a memory cell having poor data retention characteristic, and an entire refresh period setting circuit for setting a multiple value m of a refreshing period. The row of the registered address is refreshed in the refresh period, and other rows are refreshed in a period m times the refreshing period. Therefore, as compared with the prior art in which all the rows are refreshed in the refresh period set for the rows including the memory cell having poor data retention characteristic, power consumption can be reduced. Further, as compared with another prior art in which the refresh period setting circuit is provided for each row, the number of circuits can be reduced.

5 Claims, 4 Drawing Sheets

SEMICONDUCTOR MEMORY DEVICE

BACKGROUND OF THE INVENTION

1. Field of the Invention

The present invention relates to a semiconductor memory device. More specifically, the present invention relates to a semiconductor memory device in which data is refreshed in response to a refresh designating signal designating data refresh.

2. Description of the Background Art

Generally, in a dynamic random access memory (hereinafter referred to as a DRAM), it is necessary to perform refreshing operation (data retaining operation) of each memory cell MC in a prescribed refresh period (of, for example, 64 ms) for holding data.

FIG. 3 is a circuit block diagram showing a structure of a DRAM having an operation mode for refreshing operation. There are several types of refreshing modes (such as RAS only refresh mode, self refresh mode). Here, CAS before RAS refresh mode (hereinafter referred to as CBR refresh mode) will be described as an example.

Referring to FIG. 3, the DRAM includes a timing circuit 31, a row · column address buffer 32, a CBR determining circuit 33, a CBR counter 34, an address selector 35, a gate circuit 36, a row address decoder 37, a sense amplifier driving circuit 38, a column decoder 39, a memory mat 40 and a data input/output buffer 50.

Timing circuit 31 outputs an activating signal φR for activating row address decoder 37, an activating signal φSA for activating sense amplifier driving circuit 38 and an activating signal φL for activating column decoder 39, respectively, as prescribed timing, in accordance with externally applied control signals /RAS, /CAS and /WE.

Row · column address buffer 32 latches externally applied address signals A0 to An (where n is a natural number) at a time of fall of control signal /RAS, and applies the latched address signals A0 to An to address selector 35 as a row address RA. Row · column address buffer 32 latches address signals A0 to An at the time of fall of control signal /CAS, and applies the latched address signals A0 to An to column decoder 39 as a column address CA.

CBR determining circuit 33 outputs a refresh designating signal φCBR in response to setting of CBR refresh mode, that is, in response to the fall of control signal /CAS before the fall of control signal /RAS.

CBR counter 34 is a counter having the same number of bits n+1 as address signals A0 to An, which counts fall of refresh designating signal φCBR and outputs n+1 bits of internal address signals A0' to An' to address selector 35 as a refresh address $X_{CBR}$.

Address selector 35 is controlled by refresh designating signal φCBR, and it couples row · column address buffer 32 and row address decoder 37 at the time of reading and writing operations, while this couples CBR counter 34 and row address decoder 37 at the time of refreshing operation.

Gate circuit 36 interrupts input of activating signal φL from timing circuit 31 to column decoder 39 in response to refresh designating signal φCBR, so as to inactivate column decoder 39 at the time of refreshing operation.

Memory mat 40 includes a plurality of memory cells MC arranged in row and column directions, a word line WL provided corresponding to each row, a bit line pair BL, /BL provided for each column, and a sense amplifier 42 and a column selection gate 47 provided corresponding to each bit line pair BL, /BL. Memory cells MC, word lines WL and bit line pairs BL, /BL constitute a memory cell array 41.

Each memory cell MC includes an N channel MOS transistor Q for accessing, and a capacitor C for storing data. MOS transistor Q and capacitor C are connected in series between a cell plate and one of the paired bit lines BL, /BL, and MOS transistor Q has its gate connected to the word line WL of the corresponding row. When the word line WL is raised to the "H" level which is the activation level, MOS transistor Q is rendered conductive so that charges (data) is exchanged between capacitor C and one of the paired bit lines BL, /BL.

Sense amplifier 42 includes N channel MOS transistors 43 and 44 connected between paired bit lines BL, /BL and a node N31, respectively, and P channel MOS transistors 45 and 46 connected between paired bit lines BL, /BL and a node N32, respectively. MOS transistors 43 and 45 have their gates both connected to bit line /BL, and MOS transistors 44 and 46 have their gates both connected to bit line BL. Nodes N31 and N32 receive sense amplifier activating signals /SE and SE output from sense amplifier driving circuit 38. Sense amplifier 42 is activated by sense amplifier activating signals /SE, SE, and amplifies small potential difference generated between the paired bit lines BL, /BL by the activation of memory cells MC through the power supply voltage Vcc.

Column selection gate 47 includes N channel MOS transistors 48, 49 connected between paired bit lines BL, /BL and signal input/output lines IO, /IO, respectively. MOS transistors 48 and 49 have their gates connected to column decoder 39 through a column selection line CSL. When column selection line CSL is raised to the "H" level which is the activation level, MOS transistors 48 and 49 are rendered conductive, so that bit line pair BL, /BL and signal input/output line pair IO, /IO are connected to each other.

Row address decoder 37 is activated by activating signal φR, and raises one of the plurality of word lines WL0, WL1, ... of memory cell array 41 to the active level of "H", in accordance with a row address RA or a refresh address $X_{CBR}$ applied from row · column address buffer 32 or CBR counter 34 through address selector 35.

Sense amplifier driving circuit 38 is activated by activating signal φSA and applies sense amplifier activating signal SE, /SE to sense amplifier 42.

Column decoder 39 is activated by activating signal φL and raises one of the plurality of column selection lines CSL to the active level of "H" in accordance with column address CA applied from row · column address buffer 32.

At the time of writing, data input/output buffer 50 applies an externally applied data to selected memory cell MC in response to an externally applied control signal /WE. At the time of reading, data input/output buffer 50 outputs data of a selected memory cell MC externally in response to an externally applied control signal /OE.

FIG. 4 is timing chart showing the operation of the DRAM shown in FIG. 3.

In a normal write/read cycle, control signal /RAS falls before control signal /CAS. Therefore, an output signal φCBR from CBR determining circuit 33 is kept at the "L" level, which is an inactive level. Therefore, address selector 35 outputs row address RA output from row · column address buffer 32 to row address decoder 37. Thereafter, in accordance with activating signals φR, φL, φSA generated by timing circuit 31, row address decoder 37, sense amplifier driving circuit 38, column decoder 39 and data input/output buffer 50 are activated, and write/read operation is performed.

More specifically, at the time of writing, column decoder 39 raises column selection line CSL of a column in accordance with the column address signal CA to the active level of the "H", and renders column selection gate 47 conductive.

Data input/output buffer 50 applies write data to a selected pair of bit lines BL, /BL through signal input/output line pair IO, /IO, in response to control signal /WE. Write data is applied as potential difference between bit lines BL and /BL.

Thereafter, row address decoder 37 raises a word line WL of a row corresponding to the row address RA to the active level of "H", so that MOS transistor Q of the memory cell MC belonging to the row is rendered conductive. To the capacitor C of the selected memory cell MC, charges of which amount correspond to the potential of bit line BL or /BL are stored.

In reading operation, first, the potential of the bit lines BL and /BL are equalized at a prescribed potential Vcc/2, and thereafter, row address decoder 37 raises the word line WL of the row corresponding to the row address RA to the active level of "H". Consequently, the potentials of bit lines BL and /BL change slightly, in accordance with the amount of charges stored in the capacitor C of the activated memory cell MC.

Thereafter, sense amplifier driving circuit 38 raises sense amplifier activating signal SE to the "H" level, and lowers sense amplifier activating signal /SE to the "L" level, so as to activate sense amplifier 42. When the potential of bit line BL is slightly higher than the potential of bit line /BL, resistance values of MOS transistors 44 and 45 become smaller than the resistance values of MOS transistors 43 and 46, so that the potential of bit line BL is pulled up to the "H" level, while the potential of bit line /BL is pulled down to the "L" level. By contrast, when the potential of bit line /BL is slightly higher than the potential of bit line BL, resistance values of MOS transistors 43 and 46 become smaller than the resistance values of MOS transistors 44 and 45, so that the potential of bit line /BL is pulled up to the "H" level, while the potential of bit line BL is pulled down to the "L" level.

Thereafter, column decoder 39 raises a column selection line CSL of the column corresponding to column address CA to the active level of "H", so that column selection gate 47 is rendered conductive. Data input/output buffer 50 outputs potential difference between the selected bit line pair BL, /BL, that is, read data, externally, in response to control signal /OE.

Since the charges stored in capacitor C of the memory cell MC flow out gradually even when MOS transistor Q is non-conductive, the data is refreshed in a prescribed refresh period.

In the CBR refresh cycle, control signal /RAS falls earlier than control signal /CAS. Therefore, output signal φCBR of CBR determining circuit 33 is raised to the "H" level, which is the active level. Therefore, address selector 35 outputs the refresh address $X_{CBR}$ outputs from CBR counter 34 to row address decoder 37.

Thereafter, row address decoder 37 and sense amplifier driving circuit 38 are activated by activating signals φR and φSA generated by timing circuit 31, and the memory cell MC connected to the word line WL of the row corresponding to the refresh address $X_{CBR}$ is performed. Refreshing operation is similar to reading operation, except that column decoder 39 and data input/output buffer 50 are not activated.

By the fall of refresh designing signal φCBR, CBR counter 34 is counted up, and CBR counter 34 outputs an address $X_{CBR}+1$ of the row to be refreshed in the next CBR refresh operation.

The CBR refresh operation is carried out in a prescribed refreshing period, which is predetermined for the DRAM chip. The refreshing period is set considering the memory cell MC having the poorest data retention characteristic, so as to ensure data retention of every memory cell MC.

However, most of the memory cells MC in the DRAM have sufficiently higher data retention characteristic than the memory cell MC having the poorest data retention characteristic, which is used as a reference to set the refreshing period. In other words, unnecessary refreshing operation is performed on the memory cells MC having sufficiently higher data retention characteristic, which means that excessive power is consumed.

In view of the foregoing, a method has been proposed in which a refresh period setting circuit is provided for each row, so as to allow setting of refreshing period of each row to take into account a memory cell having the poorest data retention characteristic in the row, to elongate the refreshing period as a whole and to reduce excessive power consumption (see Japanese Patent Laying-Open No. 4-34794).

However, according to this method, it becomes necessary to provide a refresh period setting circuit for each row. Therefore, the number of circuits is increased and the layout area is increased. This is more true in a DRAM of a so called shared sense amplifier structure in which memory cell arrays are divided into a plurality of blocks and refreshing operation is performed block by block to reduce power consumption. Further, if the number of memory cells having poorer data retention characteristic is small as compared with the total number of memory cells, most of the refresh period setting circuits are not used and wasted.

SUMMARY OF THE INVENTION

Therefore, an object of the present invention is to provide a semiconductor memory device which consumes less power and which includes smaller number of circuits.

The semiconductor memory device in accordance with the present invention performs data refresh in response to a refresh designating signal designating data refresh, that includes a memory cell array, an address designating circuit, an address registration circuit, a first signal generating circuit, a second signal generating circuit and a refreshing circuit. The memory cell array includes a plurality of memory cells arranged in a matrix. The address designating circuit counts the refresh designating signal, and in accordance with the count value, designates once in a predetermined refresh period, each address of all the memory cell rows of the memory cell array. The address registration circuit is provided for registering an address of a row of a memory cells including a memory cell of which data refresh must be performed within a period not longer than m times the refresh period in the memory cell array. The first signal generating circuit outputs a first refresh permitting signal in response to coincidence of an address designated by the address designating circuit and the address registered by address registration circuit. The second signal generating circuit outputs a second refresh permitting signal every time address of each memory cell row of a memory cell array is designated m times by the address designating circuit. The refreshing circuit refreshes data of the row of memory cells of the address designated by the address designating circuit, in response to the first and second refresh permitting signals output from the first and second signal generating circuits.

In the semiconductor memory device, an address registration circuit is provided for registering an address of a row of memory cells including a memory cell having poor data retention characteristic, whereby the row of memory cells of the registered address is refreshed in a prescribed refreshing period, while rows of memory cells of the addresses not registered are refreshed in a period m times the refreshing period. Therefore, as compared with the prior art example in which all the rows of memory cells are refreshed in the same refreshing period as the period set for the row of memory cells including the memory cell of poor data retention characteristic, power consumption can be reduced. Further, different from the prior art example in which refresh period setting circuit is provided for each row of memory cells, the number of circuits can be reduced.

Preferably, the address of each row of memory cells in the memory cell array is specified by address signals of n bits and the address designating circuit includes n flipflops connected in series, each outputting an address signal of 1 bit. Therefore, the address designating circuit can be formed easily.

Preferably, the address registration circuit includes a fuse pair provided corresponding to each flipflop, for registering an address signal of 1 bit by the blowing of one or the other of the pair. Therefore, the address of the row of memory cells including the memory cell having low data retention characteristics can be easily and surely registered.

Preferably, the first signal generating signal includes a pair of transistors provided corresponding to each flipflop for interrupting output of the first refresh permitting signal in response to non-coincidence of the address signal of 1 bit output from the corresponding flipflop and the address signal of 1 bit registered by the corresponding fuse pair. Therefore, the first signal generating circuit can be formed easily.

Preferably, the second signal generating circuit includes k flipflops connected in series, fuse pairs provided corresponding to respective flipflops, and transistor pairs provided corresponding to respective flipflops. The k flipflops connected in series receives an output signal of the last stage flipflop of the n flipflops in the address designating circuit, and each outputs a count signal of 1 bit. The fuse pair is provided for registering the count signal of 1 bit by the blowing of one or the other of the pair. The transistor pair is provided for interrupting output of the second refresh permitting signal in response to non-coincidence between the count signal of 1 bit output from the corresponding flipflop and the count signal of 1 bit registered by the corresponding fuse pair. Therefore, it becomes possible to set the multiple value of n of the refresh period to a desired value.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
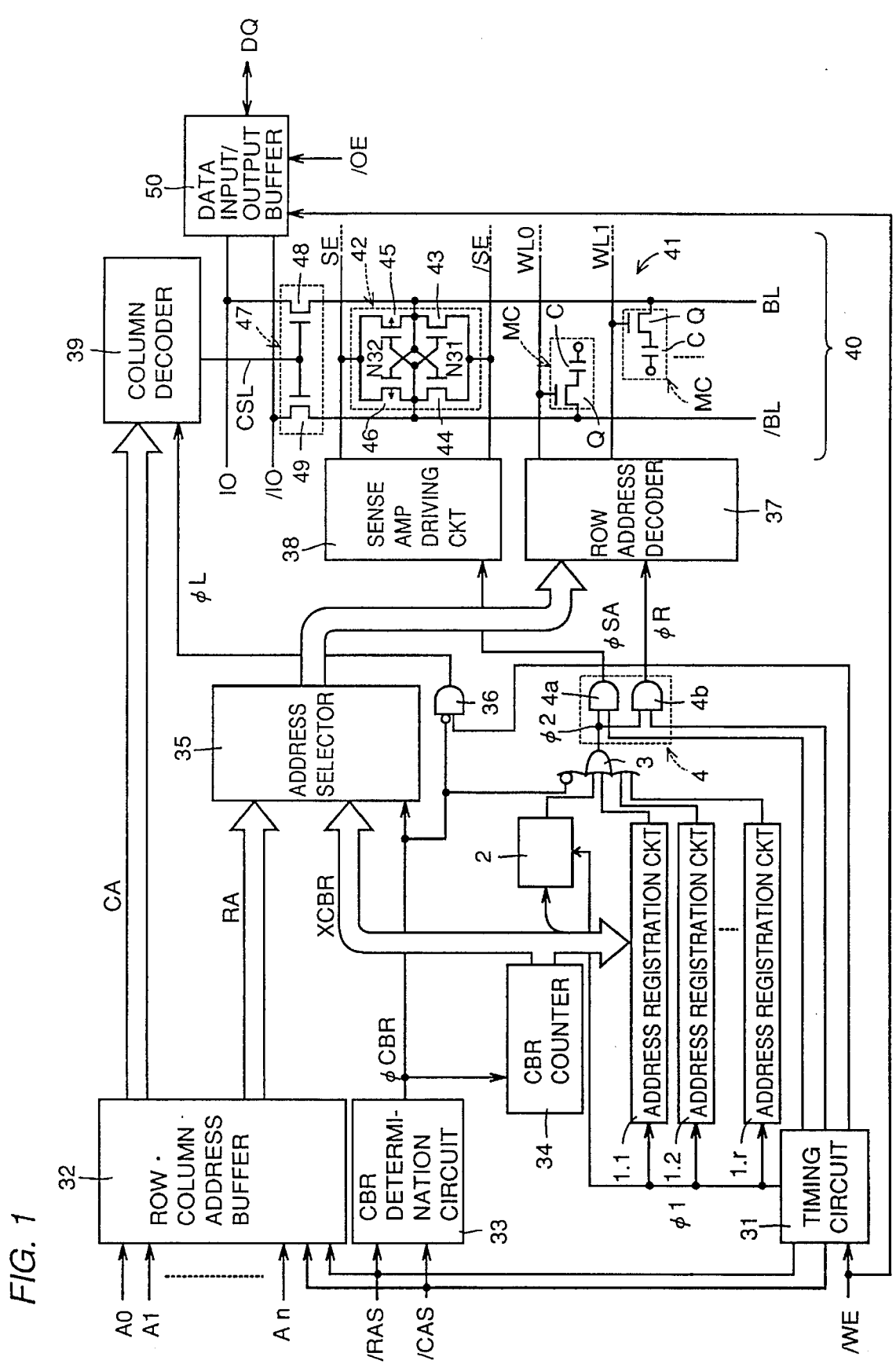
FIG. 1 is a circuit block diagram showing a structure of a DRAM in accordance with one embodiment of the present invention.
Figure 2:
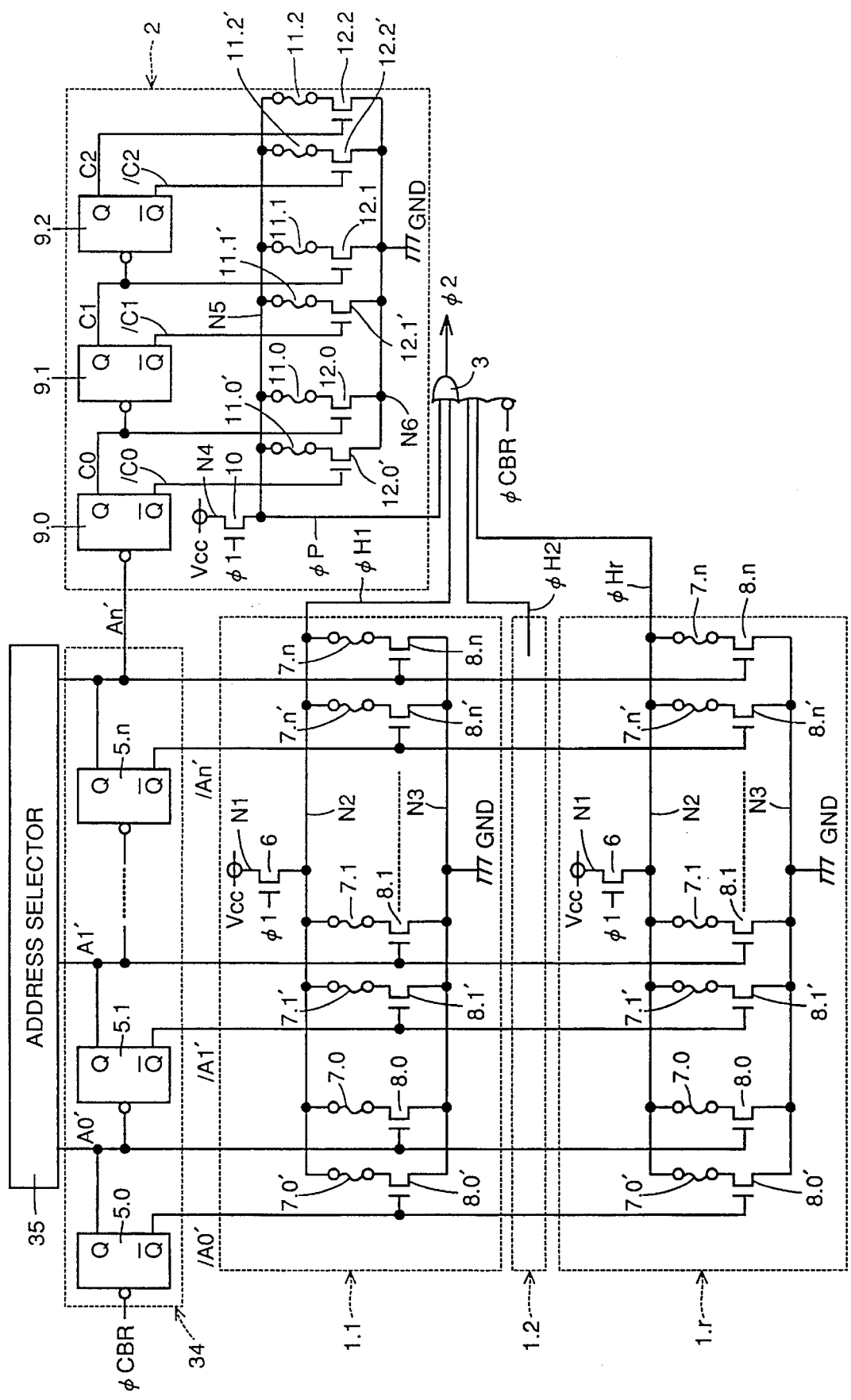
FIG. 2 is a circuit block diagram showing details of the main portion of the DRAM shown in FIG. 1.
Figure 3:
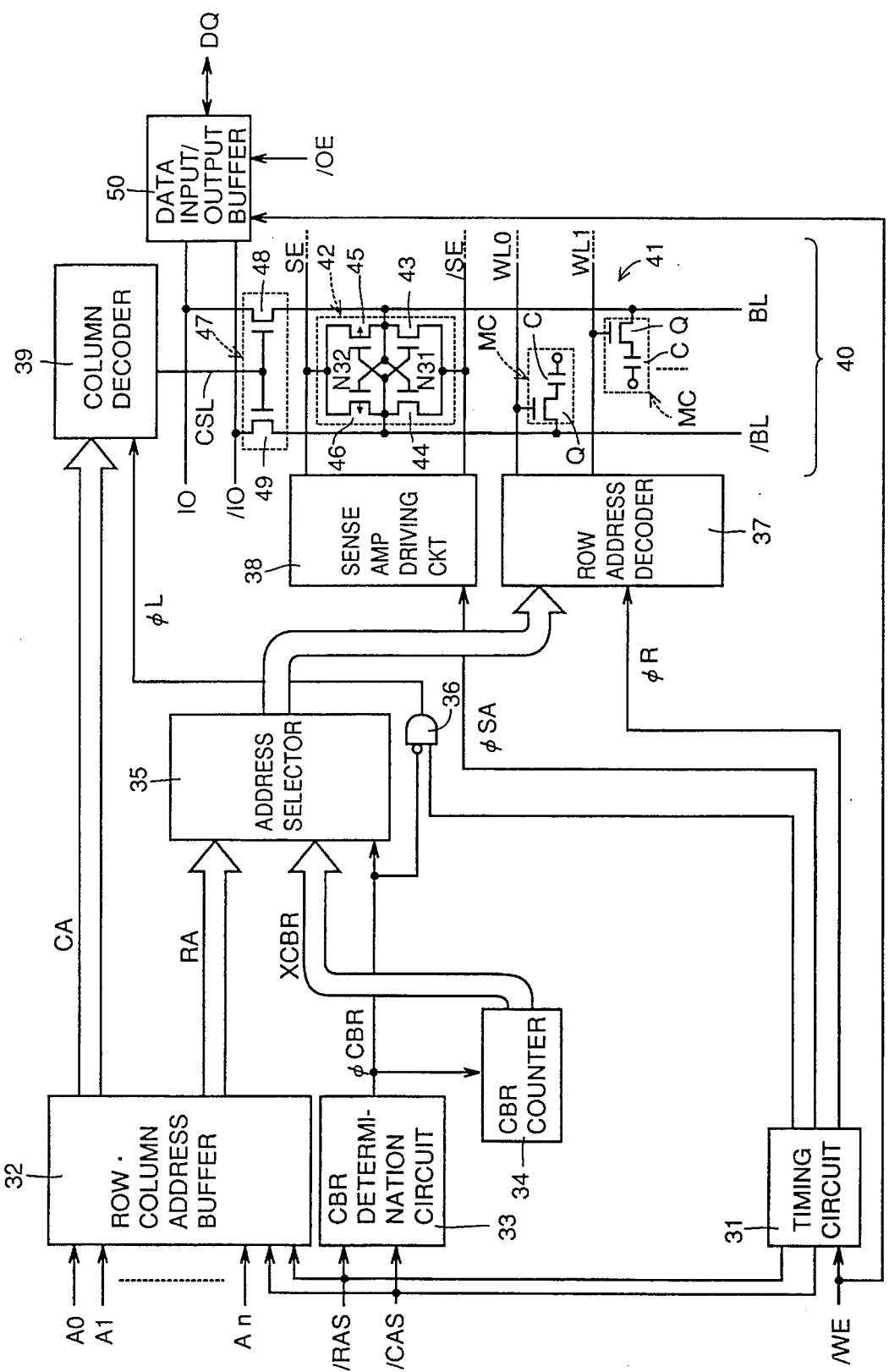
FIG. 3 is a block diagram showing a structure of a conventional DRAM.
Figure 4:
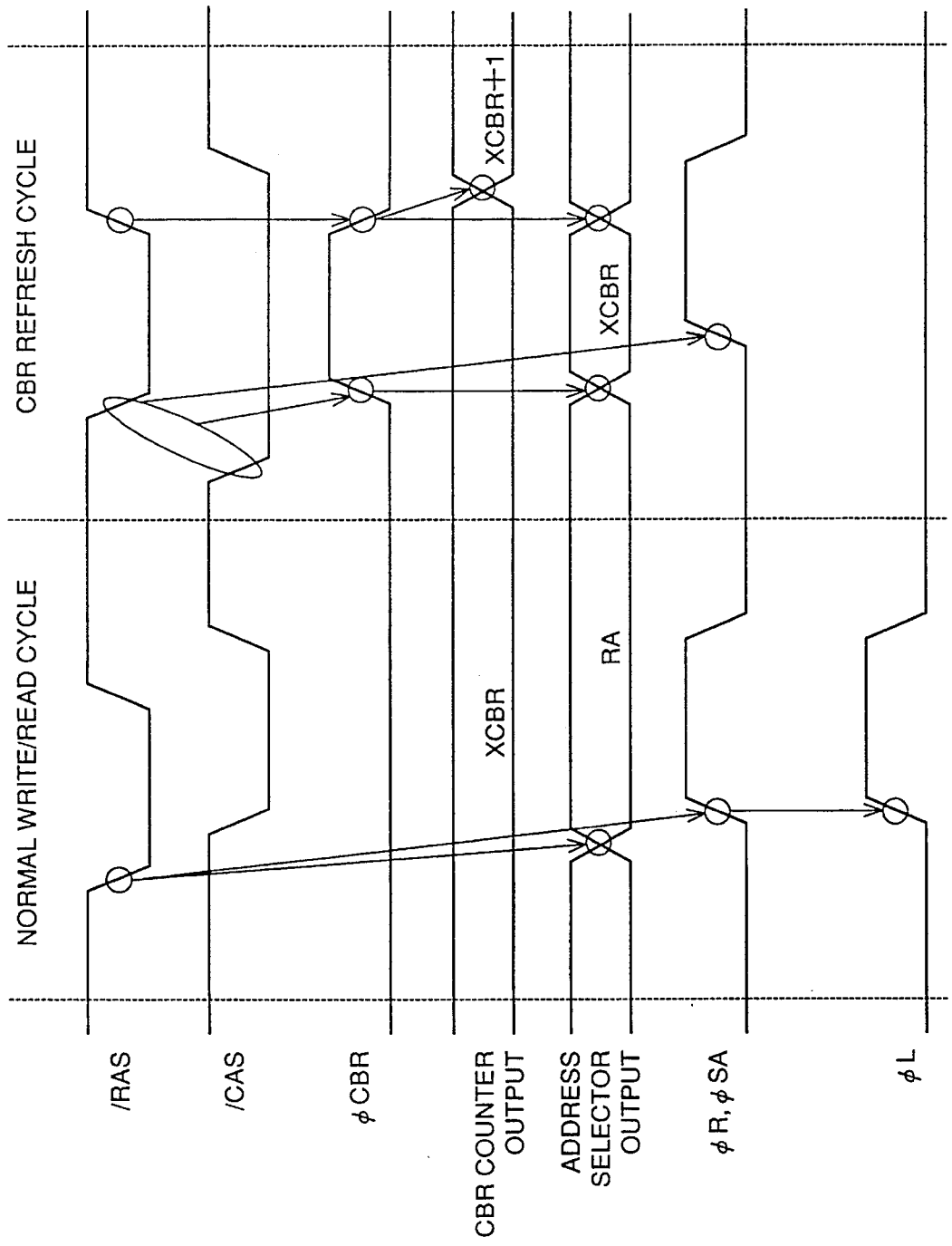
FIG. 4 is a timing chart showing the operation of the DRAM of FIG. 3.

Referring to FIGS. 1 and 2, the DRAM differs from the conventional DRAM shown in FIG. 3 in that it is newly provided with address registration circuits 1.1 to 1.r (where r is a natural number smaller than the number of row addresses), an entire refresh period setting circuit 2, a gate circuit 3 and a refresh operation inhibiting circuit 4. Timing circuit 31 outputs an activating signal $\phi 1$ for activating each of address registration circuits 1.1 to 1.r and entire refresh period setting circuit 2. Activating signal $\phi 1$ is the same as the activating signal $\phi R$, $\phi SA$ or a signal provided by delaying these signals.

CBR counter 34 includes n+1 flipflops 5.0 to 5.n connected in series. Each of the flipflops 5.0 to 5.n is inverted in response to a fall of an input signal. To the flipflop 5.0 of the initial stage, refresh designating signal $\phi CBR$ is input. Flipflops 5.0 to 5.n output internal address signals A0' to An' and inverted signals /A0' to /An', respectively.

Count value A0' ... An' of CBR counter 34 is implemented by one every time the refresh designating signal $\phi CBR$ falls. Therefore, every time the refresh designating signal $\phi CBR$ is input, a different row address is designated. Internal address signals A0' to An' are input to address selector 35 and address registration circuits 1.1 to 1.r. Inverted signals /A0' to /An' are input to address registration circuits 1.1 to 1.r. Internal address signal An' is input to entire refresh period setting circuit 2.

Address registration circuit 1.1 includes an N channel MOS transistor 6, n+1 sets of fuses 7.0 to 7.n and N channel MOS transistors 8.0 to 8.n provided corresponding to output signals A0' to An' of flipflops 5.0 to 5.n, respectively, and n+1 sets of fuses 7.0' to 7.n' and N channel MOS transistor 8.0' to 8.n' provided corresponding to inverted output signals /A0' to /An' of flipflops 5.0 to 5.n, respectively.

N channel MOS transistor 6 is connected between nodes of N1 and N2, and receives at its gate the activating signal $\phi 1$. Power supply potential Vcc is applied to node N1.

The fuse and N channel MOS transistor of the same set, that is, 7.0 and 8.0, ... , 7.n and 8.n are connected in series between nodes N2 and N3, respectively. N channel MOS transistors 8.0 to 8.n receive at their gates the signals A0' to An', respectively. Ground potential GND is applied to node N3.

Similarly, the fuse and N channel MOS transistor of the same set, that is, 7.0' and 8.0', ... 7,n' and 8.n' are connected in series between nodes N2 and N3, respectively. N channel MOS transistors 8.0' to 8.n' receive at their gates signals /A0' to /An', respectively.

In address registration circuit 1.1, an address of a row including a memory cell MC having poor data retention characteristic, which must be refreshed within a period shorter than m times the refresh period (where m is an natural number) is registered.

Address registration is done by blowing one or the other of each of the fuse pairs 7.0, 7.0'; ... ; 7.n, 7,n'. For example, the address of the row including the memory cell MC having poor data retention characteristic is A0 ... An=10 ... 0, then the fuse 7.0 corresponding to internal address signal A0' and fuses 7.1' to 7.n' corresponding to inverted signals /A1' to /An' of the internal address signals are blown off, while other fuses 7.0', 7.1 to 7.n are not blown.

In this example, when internal address signals A0' ... An' attain 10 ... 0 and coincide with the registered row address, then current does not flow through MOS transistors 8.0 to 8.n and 8.0' to 8.n' in address registration circuit 1.1, and hence the potential at node N2, that is, the refresh permitting signal $\phi H1$ is set to the active level of the "H".

Meanwhile, if the internal address signals A0' ... An' do not coincide with the registered row address, current flows from node N2 to node N3 through any of the MOS transistors 8.0 to 8.n and 8.0' to 8.n' in address registration circuit 1.1, so that the refresh permitting signal φH1 attains to the inactive level of "L".

Structure and operation of other address registration circuit 1.2 to 1.r are the same as those of address registration circuit 1.1. Output signals φH1 to φHr from address registration circuit 1.1 to 1.r are input to gate circuit 3.

Entire refresh period setting circuit 2 includes k (where k is a natural number, and in this example k=3) flipflops 9.0 to 9.2 connected in series. Output from each of flipflops 9.0 to 9.2 is inverted in response to the fall of an input signal. Internal address signal An' is input to the flipflop 9.0 of the initial stage. Flipflops 9.0 to 9.2 output count signals C0 to C2 and inverted signals thereof, that is, /C0 to /C2, respectively. Count value C0 ... Cn of the counter constituted by flipflops 9.0 to 9.2 is implemented by one every time the internal address signal An' falls, in other words, every time the entire row addresses are designated once.

The entire refresh period setting circuit 2 includes an N channel MOS transistor 10, three sets of fuses 11.0 to 11.2 and N channel MOS transistors 12.0 to 12.2 provided corresponding to output signals C0 to C2 from flipflops 9.0 to 9.2, respectively, and three sets of fuses 11.0' to 11.2' and N channel MOS transistors 12.0' to 12.2' provided corresponding to inverted output signals /C0 to /C2 from flipflops 9.0 to 9.2, respectively.

N channel MOS transistor 10 is connected between nodes N4 and N5 and receives at its gate the activating signal φ1. Power supply potential Vcc is applied to node N4.

The fuse and N channel MOS transistor of the same set, that is, 11.0 and 12.0 ..., 11.2 and 12.2 are connected in series between nodes N5 and N6, respectively. N channel MOS transistors 12.0 to 12.2 receive at their gates, the signals C0 to C2, respectively. Ground potential GND is applied to node N6.

Similarly, the fuse and N channel MOS transistor of the same set, that is, 11.0' and 12.0', ..., 11.2' and 12.2' are connected in series between nodes N5 and N6, respectively. N channel MOS transistors 12.0' to 12.2' receive at their gates the inverted signals /C0 to /C2 of the count signals.

Setting of the entire refresh period is performed by blowing fuses 11.0 to 11.2, and 11.0' to 11.2'. For example, if most of the memory cells MC has such data retention characteristic that requires refreshing in a period longer than m=4 times the refreshing period, then only the fuses 11.0', 11.1', 11.2 and 11.2' corresponding to signals /C0, /C1, C2, and /C2 are blown off and other fuses 11.0 and 11.1 are not blown.

In this case, if the count values C0, C1 and C2 attain 000 or 001, no current flows through MOS transistors 12.0 to 12.2, 12.0' to 12.2' in entire refresh period setting circuit 2, and the potential at node N5, that is, refresh permitting signal φP attains to the active level of "H".

Meanwhile, if the count values C0, C1 and C2 is not 000 nor 001, current flows from node N5 to N6 to any of MOS transistors 12.0 to 12.2 and 12.0' to 12.2' in entire refresh period setting circuit 2, so that refresh permitting signal φP attains to the inactive level of "L".

Therefore, of the period in which all the row addresses are designated eight times by CBR counter 34, refresh permitting signal φP attains to the "H" only twice.

Gate circuit 3 outputs a logical sum (OR) signal of refresh permitting signals φH1 to φHr output from address registration circuit 1.1 to 1.r, refresh permitting signal φP output from entire refresh period setting circuit 2 and inverted signal of refresh designating signal φCBR output from CBR determining circuit 33 as a refresh permitting signal φ2, to refresh operation inhibiting circuit 4.

Refresh operation inhibiting circuit 4 includes two AND gates 4a and 4b. AND gate 4a receives refresh permitting signal φ2 and activating signal φSA. An output from AND gate 4a is input to sense amplifier driving circuit 38. Another AND gate 4b receives refresh permitting signal φ2 and activating signal φR. An output from AND gate 4b is input to row address decoder 37.

If refresh permitting signal φ2 is at the active level of "H", activating signals φSA and φR pass through gates 4a and 4b, permitting activation of sense amplifier driving circuit 38 and row address decoder 37. Meanwhile if refresh permitting signal φ2 is at the inactive level of "L", activation signals φSA and φR are stopped at gates 4a and 4b, and hence activation of sense amplifier driving circuit 38 and row address decoder 37 is inhibited.

The operation of the DRAM shown in FIGS. 1 and 2 will be described.

In normal writing/reading operation, the output φCBR from CBR determining circuit 33 is at the "L" level, so that address selector 35 applies row address RA to row address decoder 37. Further, refresh permitting signal φ2 attains to the "H" level, and AND gates 4a and 4b pass activating signals φSA and φR. Gate circuit 36 passes the activating signal φL. Therefore, a memory cell MC designated by row address RA and column address CA is selected and data is written/read.

In CBR refreshing operation, the output φCBR from CBR determining circuit 33 is at the "H" level, and hence address selector 35 applies the refresh address $X_{CBR}$ output from CBR counter 34 to row address decoder 37. Gate circuit 36 stops passage of activating signal φL.

When the refresh address $X_{CBR}$ coincides with the address registered, for example, in address registration circuit 1.1, the output φH1 from address registration circuit 1.1 attains to the "H" level, and refresh permitting signal φ2 attains to the "H" level. Therefore, passage of activating signals φSA and φR is permitted, and the row designated by the refresh address $X_{CBR}$ is refreshed.

Even when refresh address $X_{CBR}$ is not registered in any of address registration circuit 1.1 to 1.r, the output φP from entire refresh period setting circuit 2 attains to the "H" level twice in a period in which all row addresses are designated 8 times. Therefore, passage of activating signals φSA and φR is permitted, and the row designated by the refresh address $X_{CBR}$ is refreshed. Namely, the rows of the addresses which are not registered in address registration circuit 1.1 to 1.r, data are refreshed in a period four times the refreshing period.

As described above, in the present embodiment, the row including a memory cell MC having poor data retention characteristic which requires refreshing in a period shorter than m times the refreshing period is refreshed by every refreshing period, and other rows are refreshed in a period m times the refreshing period. Therefore, as compared with the prior art in which all the rows are refreshed in the same refreshing period, the number of refreshing operation can be reduced, and power consumption can be reduced.

Further, since address registration circuits 1.1 to 1.r for registering an address of a row including the memory cell MC having poor data retention characteristic are provided, the number of circuits can be reduced and layout area can be reduced as compared with the prior art in which refresh period setting circuit is provided for each row address.

Further, since the entire refresh period can be set at a desired value, it is very convenient. Further, registration of the row address including the memory cell MC having poor data retention characteristic and setting of the entire refresh period are performed by blowing/not blowing fuses. Therefore, registration and setting can be surely performed easily.

In the above described embodiment, the present invention was applied to a DRAM employing CBR refresh mode. However, it goes without saying that the present invention is also applicable to DRAMs employing other refresh modes.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device in which data is refreshed in response to a refresh designating signal designating data refresh, comprising:

a memory cell array including a plurality of memory cells arranged in a matrix;

address designating means for counting said refresh designating signal for designating once in a predetermined refresh period, addresses of all rows of memory cells in said memory cell array in accordance with the counted value;

address registration means for registering an address of a row of memory cells including a memory cell requiring refreshing of data in a period shorter than m times said refreshing period, of said memory cell array;

first signal generating means for outputting a first refresh permitting signal in response to coincidence between an address designated by said address designating means and an address registered by said address registration means;

a second signal generating means for outputting a second refresh permitting signal every time an address of each row of memory cells of said memory cell array is designated m times by said address designating means; and refreshing means responsive to said first and second refresh permitting signals output from said first and second signal generating means for refreshing data of a row of memory cells of the address designated by said address designating means.

2. The semiconductor memory device according to claim 1, wherein an address of each row of memory cells of said memory cell array is specified by address signals of n bits, and said address designating means includes n flipflops connected in series, each outputting an address signal of 1 bit.

3. The semiconductor memory device according to claim 2, wherein said address registration means includes a pair of fuses provided corresponding to each flipflop for registering an address signal of 1 bit by blowing off of one or the other of the pair.

4. The semiconductor memory device according to claim 3, wherein said first signal generating means includes a pair of transistors provided corresponding to each flipflop for interrupting output of said first refresh permitting signal, in accordance with non-coincidence between an address signal of 1 bit output from the corresponding flipflop and an address signal of 1 bit registered by the corresponding fuse pair.

5. The semiconductor memory device according to claim 4, wherein said second signal generating means includes k flipflops connected in series, receiving an output signal from a flipflop of a last stage of the n flipflops of said address designating means, each outputting a count signal of 1 bit, a fuse pair provided corresponding to each flipflop for registering a count signal of 1 bit by blowing of one or the other of the pair, and a transistor pair provided corresponding to each flipflop for interrupting output of said second refresh permitting signal in accordance with non-coincidence between the count signal of 1 bit output from the corresponding flipflop and the count signal of 1 bit registered by the corresponding fuse pair.

* * * * *